US006365919B1

(12) United States Patent
Tihanyi et al.

(10) Patent No.: US 6,365,919 B1
(45) Date of Patent: Apr. 2, 2002

(54) SILICON CARBIDE JUNCTION FIELD EFFECT TRANSISTOR

(75) Inventors: Jenoe Tihanyi, Kirchheim; Heinz Mitlehner, Uttenreuth; Wolfgang Bartsch, Erlangen, all of (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/530,622

(22) PCT Filed: Sep. 1, 1999

(86) PCT No.: PCT/DE99/02755

§ 371 Date: Jul. 11, 2000

§ 102(e) Date: Jul. 11, 2000

(87) PCT Pub. No.: WO00/14810

PCT Pub. Date: Mar. 16, 2000

(30) Foreign Application Priority Data

Sep. 2, 1998 (DE) .......................... 198 39 969

(51) Int. Cl.$^7$ .......................... H01L 31/0312
(52) U.S. Cl. ................ 257/77; 257/261; 257/259; 257/266; 257/269; 257/279; 257/256
(58) Field of Search .................. 257/77, 261, 259, 257/266, 269, 279, 256

(56) References Cited

U.S. PATENT DOCUMENTS

| 3,254,280 A | 5/1966 | Wallace |
| 5,378,642 A | 1/1995 | Brown et al. |
| 5,465,249 A | * 11/1995 | Cooper, Jr. et al. ......... 365/149 |
| 5,679,966 A | * 10/1997 | Baliga et al. ............... 257/139 |

FOREIGN PATENT DOCUMENTS

DE  196 44 821 C1  2/1998

OTHER PUBLICATIONS

S. Sriram et al., "RF Performance of SiC MESFET's on High Resistivity Substrates", IEEE Electron Device Letters, vol. 15, No. 11, Nov. 1994, pp. 458–459.

Levinshtein et al., "Nature of the 1/f noise in 6H–SiC", Semiconductor Science and Technology, pp. 2080–2084.

* cited by examiner

Primary Examiner—Eddie Lee
Assistant Examiner—N. Drew Richards
(74) Attorney, Agent, or Firm—Schiff Hardin & Waite

(57) ABSTRACT

A lateral silicon carbide junction field effect transistor has p-conductive and n-conductive silicon carbide layers. The layers are provided in pairs in lateral direction in a silicon carbide body. Trenches for a source, a drain and a gate extend from a principal surface of the silicon carbide body and penetrate the layers. The source and drain trenches are filled with silicon carbide of one conductivity type, whereas the trench for the gate is filled with silicon carbide of a conductivity type that is different from the source and the drain.

4 Claims, 2 Drawing Sheets

SILICON CARBIDE JUNCTION FIELD EFFECT TRANSISTOR

BACKGROUND OF THE INVENTION

1. Field of the Invention

The invention is directed to a silicon carbide junction field effect transistor (FET). Specifically, the invention relates to a field effect transistor having a silicon carbide body in which p-conductive and n-conductive layers are present, and having source, drain and gate electrodes.

2. Description of Related Art

Silicon carbide junction field effect transistors can be utilized as high-voltage components in, for example, cascade circuits. They have the advantage that they can be manufactured with comparatively little outlay since dopings therein can be implanted with little difficulty.

Up to now, however, there have only been vertical structures for silicon carbide junction field effect transistors. The integration of these vertical structures is problematical due to the drain electrode being placed at the back side of the silicon carbide body.

SUMMARY OF THE INVENTION

It is therefore an object of the present invention to specify a silicon carbide junction field effect transistor having lateral structure that is simple to manufacture and that is distinguished by a high high-voltage strength.

In an embodiment, the present invention provides a silicon carbide junction filed effect transistor that includes a silicon carbide body having a principal surface. A plurality of p-conductive and n-conductive layers are embedded in pairs in the silicon carbide body in a lateral direction parallel the principal surface. At least two trenches are in the silicon carbide body as a source and a drain, respectively, and penetrate the n-conductive and p-conductive layers, the trenches are filled with highly doped silicon carbide that is either a n-conductive or p-conductive type. A third trench is a gate electrode that extends from the principal surface and penetrates the n-conductive and p-conductive layers. The third trench has an insulating layer at an edge of the third trench. The third trench is filled with a conductivity type that is opposite to the conductivity type of the at least two trenches.

It is provided in a development of the invention that the doping concentration of the p-conductive and n-conductive silicon carbide layers is not higher than $10^{13}$ charge carrier/cm$^2$. It is also advantageous that the trenches for the source and gate electrodes at least partially surround the trench for the drain electrode. The n-conductive and p-conductive silicon carbide layers can be produced by ion implantation and epitaxial deposition on a silicon carbide base member.

The invention thus creates a silicon carbide junction field effect transistor in lateral structure that can be manufactured with little difficulty and with currently available means.

Thus, non-doped, epitaxial layers that form an epi structure are deposited on a non-doped silicon carbide base member. N-conductive and p-conductive silicon carbide layers are enclosed in pairs in this epi structure, these being produced with ion implantation of n-conductive or, respectively, p-conductive dopants such as, nitrogen or, respectively, boron and/or aluminum. The uppermost layer of this epi structure remains undoped.

Narrow trenches are then etched into the epi structure. Then the trenches are epitaxially filled with, for example, n$^+$-doped silicon carbide for the source electrode and the drain electrode and with p$^+$-doped silicon carbide for the gate electrode after deposition of an insulating layer. The n$^+$-conductive and p$^+$-conductive silicon carbide layers thus applied in the trenches for source, drain and gate are finally etched back to the uppermost, undoped silicon carbide layer and are structured in this way.

Advantageously, a geometry can be selected for the electrodes wherein the trenches for the source electrode and the gate electrode surround the drain electrode.

The metallization of the silicon carbide junction field effect transistor can ensue in a standard way. It is an advantage that the interconnects of, for example, aluminum or of polycrystalline silicon can be utilized.

The doping concentration in the p-conductive or n-conductive silicon carbide layers should expediently not exceed $10^{13}$cm$^{-2}$. What this upper limitation achieves is that the p-conductive and n-conductive silicon carbide layers are cleared earlier in lateral or, respectively, transverse direction as a result of this upper limitation before a punch-through occurs, so that the silicon carbide junction field effect transistor is then distinguished by a high breakdown resistance. In other words, the inventive silicon carbide junction field effect transistor has a high breakdown voltage given a low turn-on impedance.

The invention is explained in greater detail below with reference to the drawings.

DETAILED DESCRIPTION OF THE PRESENTLY PREFERRED EMBODIMENTS

Figure 1:
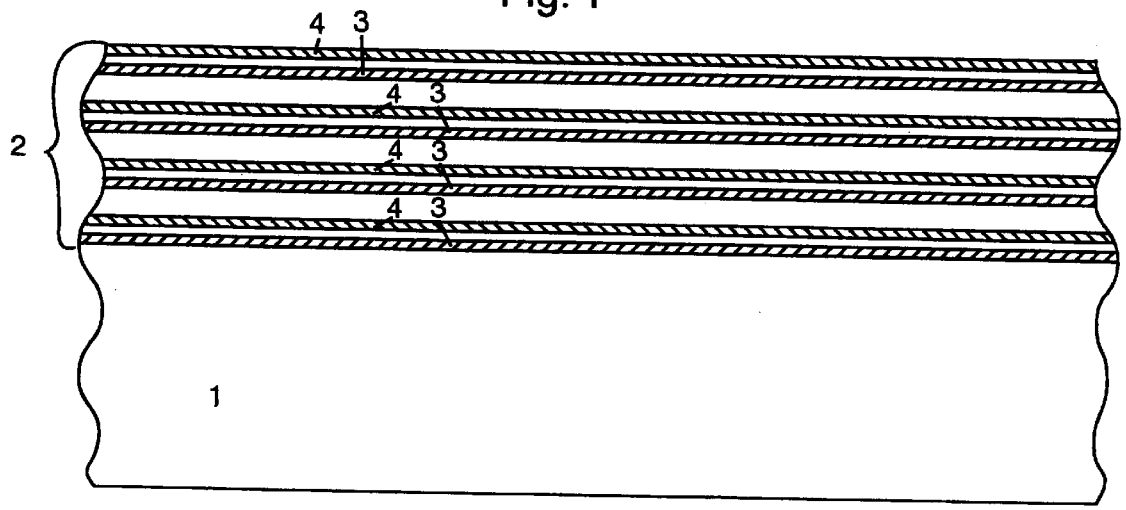
FIG. 1 is a cross section view through a silicon carbide body in which p-conductive and n-conductive silicon carbide layers are embedded in pairs in an epi structure.

FIG. 1 shows an undoped silicon carbide base member 1 on which an epi structure 2 of doped silicon carbide is provided, p-conductive silicon carbide layers 3 and n-conductive silicon carbide layers 4 being embedded in pairs within the epi structure. These p-conductive silicon carbide layers 3 and these n-conductive silicon carbide layers 4 exhibit a doping concentration that should not exceed $10^{13}$ charge carriers cm$^{-2}$. As a result the layers 3, 4 in a finished silicon carbide junction field effect transistor given an applied drain voltage are cleared earlier in transverse or, lateral direction before a punch-through occurs. In this way, similar to a junction-trench field effect transistor, a high breakdown voltage given low turn-on impedance can be achieved.

The epi structure 2 is produced in such a way that epitaxial layers are applied step-by-step onto the silicon carbide base member 1. An ion implantation with boron and/or aluminum for the layers 3 or nitrogen for the layers 4 is undertaken.

Figure 2:
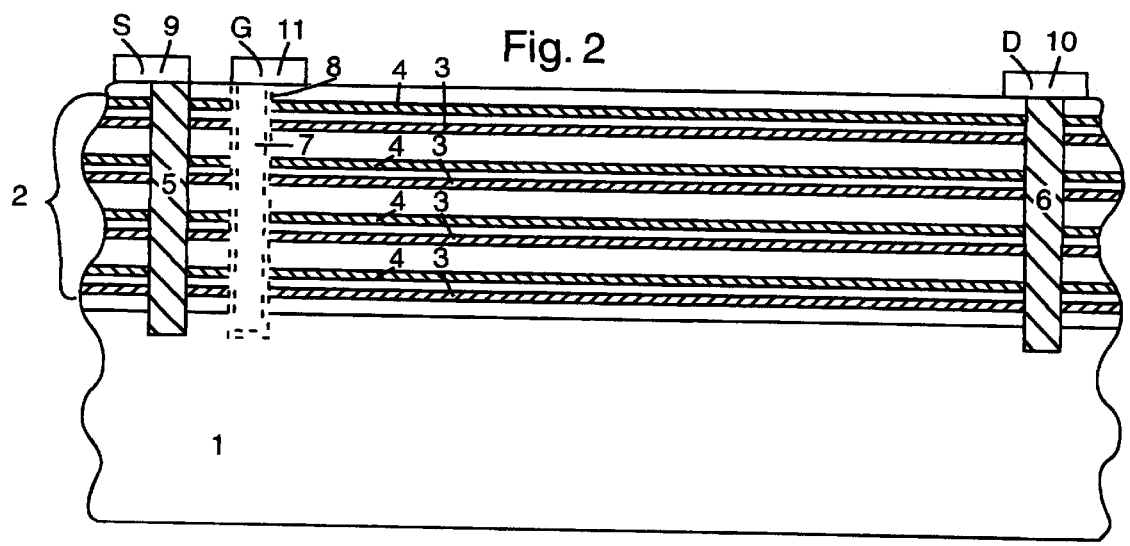
FIG. 2 is a cross sectional view through a silicon carbide junction field effect transistor according to an embodiment of the invention.

After an uppermost, undoped layer (see FIG. 2) is applied onto the silicon carbide body—shown in FIG. 1—composed of the silicon carbide base member 1 and the epi structure 2, narrow trenches for source, drain and gate are etched in the structure obtained in this way, being etched to the silicon carbide base member 1. These trenches are filled with n-doped silicon carbide for a source electrode 5 or a drain electrode 6. The wall of the trench for a gate electrode 7 is first provided with an insulating layer 8 by, for example thermal oxidation. The interior of the trench is then filled with p$^+$-doped silicon carbide. The filling of the trenches for the source, drain and gate electrode can ensue epitaxially. The n$^+$-conductive or p$^+$-conductive layers filled into the trenches are either etched back or polished off at their upper side until the uppermost, undoped silicon carbide layer has been reached. After application of, for example, electrodes 9, 10 and 11 composed of aluminum for source S, drain D and gate G, the silicon carbide junction field effect transistor shown in FIG. 2 is thus ultimately present. In an embodiment a layer of, preferably, nickel or Permalloy (NiFe) applied by sputtering or vapor-deposition, is etched according to a desired layout (see, for example, FIG. 3) for the manufacture of the source electrode 9 and the drain electrode 10. However, Ni—Al alloy is preferably employed for the gate electrode 11. These metallizations are then preferably tempered at 980° C. and are subsequently reinforced with additionally applied aluminum for a wire bonding or with solderable metallizations (for example, NiAg).

Figure 3:
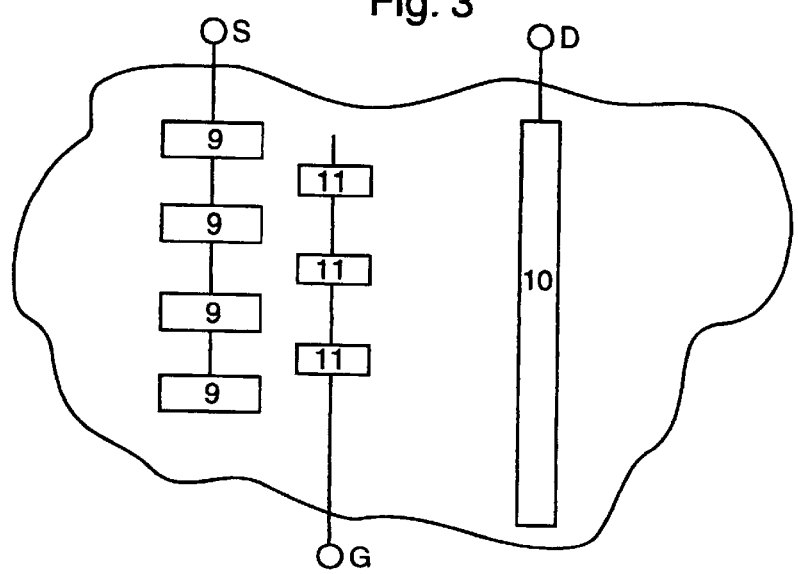
FIG. 3 is a plan view onto a possible layout of the silicon carbide junction field effect transistor of FIG. 2.
Figure 4:
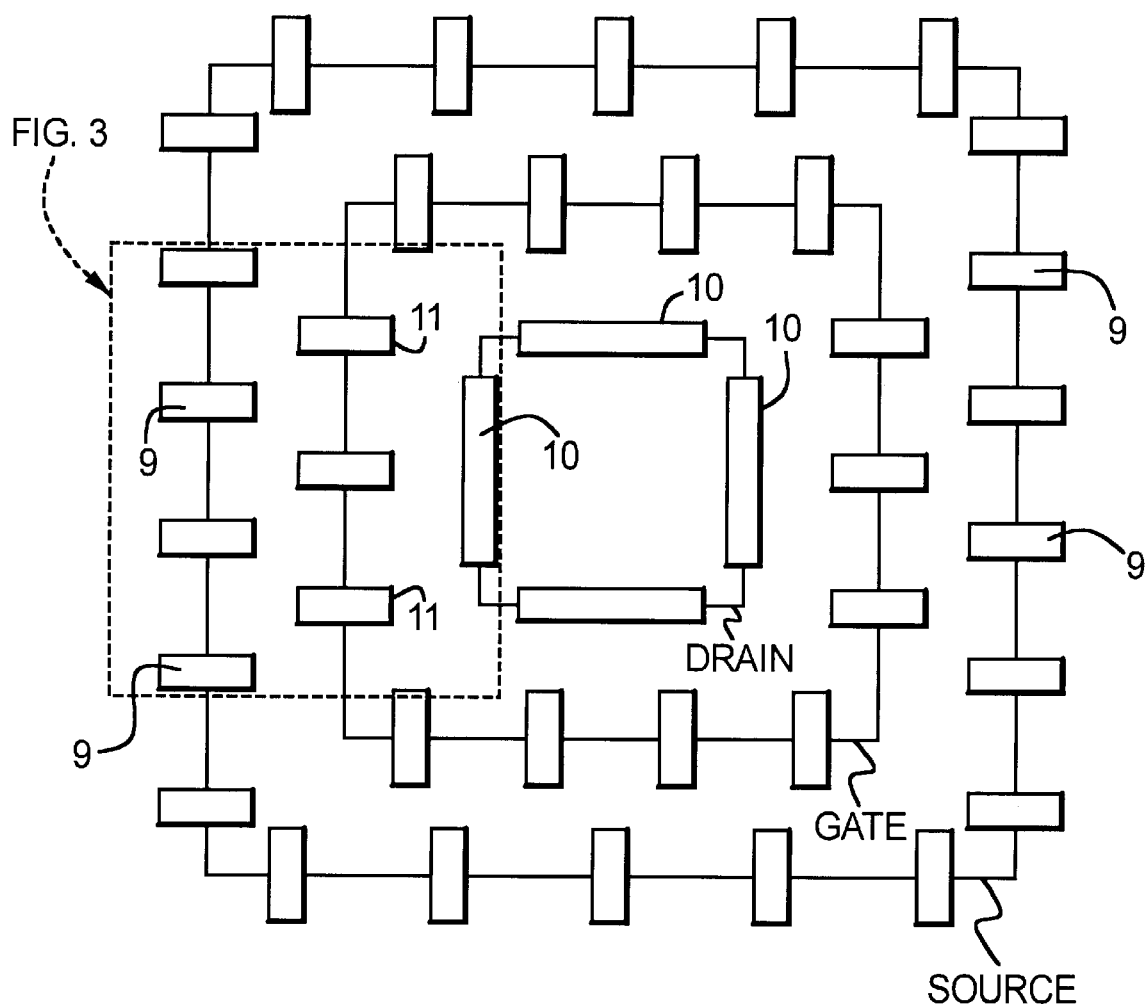
FIG. 4 is a plan view of a possible embodiment of the present silicon carbide junction field effect transistor.

FIG. 3 shows a possible layout (in plan view) for such a silicon carbide junction field effect transistor having source electrodes 9, drain electrodes 10 and gate electrodes 11. The source electrode 9 and the gate electrode 11 can thereby be arranged such that they surround the drain electrode 10, as shown in FIG. 4.

Although other modifications and changes may be suggested by those skilled in the art, it is the intention of the inventors to embody within the patent warranted hereon all changes and modifications as reasonably and properly come within the scope of their contribution to the art.

What is claimed is:

1. A silicon carbide field effect transistor, comprising:

a silicon carbide body having a principal surface;

a plurality of p-conductive and n-conductive layers being embedded, in pairs, in the silicon carbide body in a lateral direction parallel to the principal surface;

at least two trenches in the silicon carbide body as a source and a drain, the at least two trenches extending from the principal surface and penetrating the plurality of n-conductive and p-conductive layers, the at least two trenches being filled with highly doped silicon carbide of one of the n-conductive and p-conductive type; and a third trench as a gate electrode, the third trench extending from the principal surface and penetrating the plurality of n-conductive and p-conductive layers, the third trench having an insulating layer at an edge of the third trench, the third trench being filled with a conductivity type opposite to the conductivity type of the at least two trenches.

2. The silicon carbide field effect transistor of claim 1, wherein a doping concentration of the plurality of n-conductive and p-conductive layers is $\leq 10^{13}$ charge carrier/cm$^2$.

3. The silicon carbide field effect transistor of claim 1, wherein the at least two trenches surround the third trench.

4. The silicon carbide field effect transistor of claim 1, wherein the silicon carbide body includes a silicon carbide base member and the plurality of n-conductive and p-conductive layers are produced via ion implantation and epitaxial deposition on the base member.

\* \* \* \* \*